United States Patent [19]

Tomisawa et al.

[11] 4,109,208

[45] Aug. 22, 1978

[54] WAVEFORM PRODUCING SYSTEM

[75] Inventors: Norio Tomisawa; Takehisa Amano, both of Hamamatsu; Yasuji Uchiyama, Hamakita; Takatoshi Okumura, Hamamatsu, all of Japan

[73] Assignee: Nippon Gakki Seizo Kabushiki Kaisha, Hamamatsu, Japan

[21] Appl. No.: 556,951

[22] Filed: Mar. 10, 1975

Related U.S. Application Data

[63] Continuation of Ser. No. 276,103, Jul. 28, 1972, abandoned.

[30] Foreign Application Priority Data

| | | | |
|---|---|---|---|
| Jul. 31, 1971 | [JP] | Japan | 46-57830 |
| Sep. 16, 1971 | [JP] | Japan | 46-71245 |
| Sep. 31, 1971 | [JP] | Japan | 46-57831 |
| Sep. 22, 1971 | [JP] | Japan | 46-73441 |

[51] Int. Cl.[2] .......... H03B 19/00

[52] U.S. Cl. .......... 328/13; 307/225 R; 307/271; 328/14; 328/178

[58] Field of Search .......... 307/225, 233 R, 247 A, 307/247 R, 264, 271, 225 R, 233 A; 328/13, 14, 178

[56] References Cited

U.S. PATENT DOCUMENTS

| | | | |
|---|---|---|---|
| 3,204,034 | 8/1965 | Ballard et al. | 328/178 |
| 3,548,372 | 12/1970 | Yonezu | 307/247 R |
| 3,609,560 | 9/1971 | Greenberg | 307/233 |
| 3,617,726 | 11/1971 | Uchida et al. | 328/14 |
| 3,654,450 | 4/1972 | Webb | 328/14 |
| 3,689,914 | 9/1972 | Butler | 328/14 |
| 3,701,027 | 10/1972 | Belton | 328/14 |
| 3,702,441 | 11/1972 | Thrower | 328/14 |
| 3,752,973 | 8/1973 | Thorn et al. | 328/14 |
| 3,765,015 | 10/1973 | Gruner | 307/247 A |

*Primary Examiner*—Joseph E. Clawson, Jr.
*Attorney, Agent, or Firm*—Cushman, Darby & Cushman

[57] ABSTRACT

In a waveform producing system for use in, for example, an electronic musical instrument, a tone generator circuit and/or a tone control circuit including tone keyer circuits, each or either one of said tone generator circuit and said tone control circuit comprises: pulse generators associated with key-actuated switches, respectively; waveform memorizing means having at least one row of voltage dividers of which the division ratios are preset in characteristics corresponding to either the tone waveforms, the tone envelopes or the depression speeds of the key operated by the player of the instrument; sequential memory read-out means connected to the respective voltage dividers; and pulse generators thereby providing an enabling signal sequentially to the individual dividers every time a pulse is inputted from the pulse generators to read-out the memorized waveform in the form of a modified audio signal at the output side of the circuit. The memorized waveforms can arbitrarily be sampled (scanned) out by using a sampling circuit in the read-out means, thereby providing variations in the modified audio signal. The tone control circuit enables the tone level control in conformity to the depression speed of the key and tone envelope control without the need to employ the conventional charge-discharge circuit requiring a relatively large capacitance capacitor, and makes it easy to carry out circuit integration.

9 Claims, 50 Drawing Figures

FIG. 12(a)
| | | | | | | | | | | | | | | | | |
|---|---|---|---|---|---|---|---|---|---|---|---|---|---|---|---|---|
| 4th bit | 0 | 0 | 0 | 0 | 0 | 0 | 0 | 0 | 1 | 1 | 1 | 1 | 1 | 1 | 1 | 1 |
| 3rd bit | 0 | 0 | 0 | 0 | 1 | 1 | 1 | 1 | 0 | 0 | 0 | 0 | 1 | 1 | 1 | 1 |
| 2nd bit | 0 | 0 | 1 | 1 | 0 | 0 | 1 | 1 | 0 | 0 | 1 | 1 | 0 | 0 | 1 | 1 |
| 1st bit | 0 | 1 | 0 | 1 | 0 | 1 | 0 | 1 | 0 | 1 | 0 | 1 | 0 | 1 | 0 | 1 |
| DECODER OUTPUT | 0 | 1 | 2 | 3 | 4 | 5 | 6 | 7 | 8 | 9 | 10 | 11 | 12 | 13 | 14 | 15 |
FIG. 12(b)
| | | | | | | | | | | | | | | | | |
|---|---|---|---|---|---|---|---|---|---|---|---|---|---|---|---|---|
| 4th bit | 0 | 0 | 0 | 0 | 1 | 1 | 1 | 1 | 0 | 0 | 0 | 0 | 1 | 1 | 1 | 1 |
| 3rd bit | 0 | 0 | 1 | 1 | 0 | 0 | 1 | 1 | 0 | 0 | 1 | 1 | 0 | 0 | 1 | 1 |
| 2nd bit | 0 | 1 | 0 | 1 | 0 | 1 | 0 | 1 | 0 | 1 | 0 | 1 | 0 | 1 | 0 | 1 |
| 1st bit | 0 | 0 | 0 | 0 | 0 | 0 | 0 | 0 | 0 | 0 | 0 | 0 | 0 | 0 | 0 | 0 |
| DECODER OUTPUT | 0 | 1 | 2 | 3 | 4 | 5 | 6 | 7 | 8 | 9 | 10 | 11 | 12 | 13 | 14 | 15 |
FIG. 12(c)
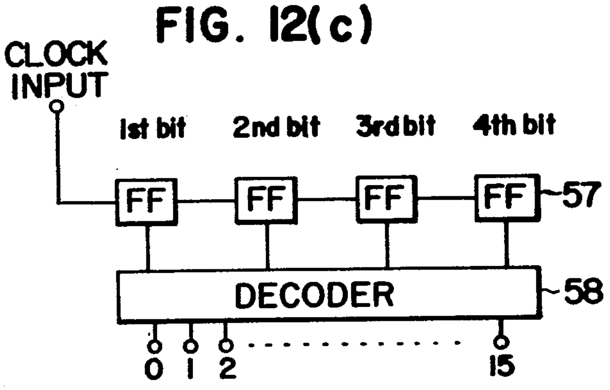
FIG. 12(d)
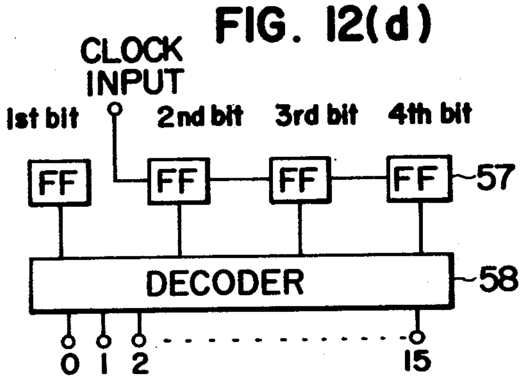

WAVEFORM PRODUCING SYSTEM

This is a continuation of application Ser. No. 276,103 filed July 28, 1972, now abandoned.

BACKGROUND OF THE INVENTION (a) Field of the Invention

The present invention pertains to a waveform producing system for use in, for example, an electronic musical instrument provided with waveform memorizing means which is utilized in tone generating circuits and/or tone modifying circuits including electronic keyers and keying circuits, and more particularly, it relates to a specific system for producing waveforms and having an aforesaid waveform memorizing means which is useful in, for example, the electronic musical instrument.

(b) Description of the Prior Art

In the conventional electronic musical instrument, a number of tone oscillators each having a different oscillation frequency are provided, whose output signals are synthesized in an appropriate manner to obtain a tone waveform. Such waveforms have been produced by another means, for example by passing a waveform containing a number of higher harmonics through filters of a complicated or sophisticated construction.

However, the conventional musical instrument which requires a number of tone oscillators or filters is too complicated to construct on a mass production basis and is difficult and troublesome to perform the adjustment of each oscillator and is not easy to obtain tone signals having desired complex waveforms. Thus, in the conventional instrument it has been hardly possible to produce natural sounds having complex and delicate waveforms resembling those produced by a natural musical instrument such as a guitar, piano and other instruments.

One conventional method for controlling or modifying the waveform of a keyed tone signal, that is, the prior method, is to provide the so-called tonal envelope characteristics to the keyed tone signal which characteristics include a build-up portion made upon the depression of a corresponding tonal key, a sustain portion and a decay portion made upon the release of the depressed key. Thus the method comprises, providing tone keyer circuits each having a charge-discharge circuit using a capacitor; applying a tone signal of a given amplitude to a corresponding one of the keyer circuits; and arranging an on-off switch provided in the charge-discharge circuit to coact with a key-operated switch. Thus, a tone signal with a predetermined envelope characteristic is obtained at the output side of the keyer circuits by the actuation of a single key. However, the charge-discharge circuit utilizing the capacitor cannot exhibit a complicated envelope characteristic which depicts a pattern consisting of an initially abrupt build-up curve with respect to the time axis, a steep descending curve at the extremity of the rise to a certain descending point and a subsequent slow decay curve, as is noted in conventional musical instruments. As a matter of fact, it has been considered in this field of art that any electronic musical instrument is acceptable for practical use only if it is provided with tone envelope characteristics substantially resembling those of the natural musical instruments even though the resulting envelope characteristics are somewhat monotonous and not sufficiently delicate.

As the tone control signal producing means for use in electronic musical instruments for producing a tone control signal in accordance with the depression speed of a playing key, there have been developed two kinds of so-called touch-responsive effect producing devices, one of which is of the type utilizing the charge-discharge function exerted by a combination of a capacitor and a resistor or resistors, and the other is of the type utilizing the induced electromotive force exerted by a combination of a magnet and a coil. In the case of the former type, it makes use of a delay curve which is determined exclusively by a time constant which, in turn, is determined by the product of the resistance of the resistor and the capacitance of the capacitor, and therefore the touch-responsive effect depends upon only the decay characteristic of the time constant, but this device is not always suitable for producing such tone signals as resembling those of the natural musical instruments at the output side of keyer circuits. Furthermore, the capacitor is required to be of a relatively large capacity in order to obtain a desired tone control signal responsive to the depression speed of the playing key, and so it has been difficult to make the tone control circuit of the instrument in the form of an integrated circuit. Because of the substantial time lag in the response between the changing-over action of a key-operated switch actuating the charge-discharge circuit and the resulting constitution of a discharge path, a maximum voltage stored on the charged capacitor cannot be derived at the output side of the tone control signal producing circuit, so that upon the maximum depression speed of the playing key, the utilization factor of the charged voltage to the tone control signal is low.

On the other hand, the aforesaid induced electromotive force type device is such that the movable magnet and the coil are arranged so that interlinked magnetic fluxes generated in the coil can vary depending on the depression speed of the playing key or the electromotive force or the voltage resulting from the interaction of the coil and the moving magnet is charged to a capacitor, thus utilizing a transient voltage variation across the capacitor during charging or a discharge characteristic of charged voltage through another discharge path. Thus, the touch-responsive effect may be said to be decided only by the factors of the coil and movable manget which are employed. This causes the same problems as mentioned above with respect to the case of the charge-discharge function type. In addition, the use of coils for generating an electromotive force makes the circuit integration of tone control circuits considerably inconvenient.

SUMMARY OF THE INVENTION

Therefore, an object of the present invention is to provide a waveform producing system for use in, for example, an electronic musical instrument, the system being of a novel type in which memorized waveforms are utilized to generate desired tone signals and/or to perform tone modifications for providing desired envelope characteristics of a keyed tone signal or for providing key-touch-responsive level control effects thereto, whereby producing musical tones resembling those of natural musical instruments with high fidelity, which eliminates the above-mentioned drawbacks of the conventional electronic musical instruments.

Another object of the present invention is to provide a waveform producing system in, for example, an electronic musical instrument comprising waveform memorizing means for memorizing various kinds of tone waveforms, a key-actuated clock oscillator acting as tone sources and waveform read-out means for deriving a tone signal having a given waveform from the memorizing means in accordance with a corresponding oscillating frequency of the actuated clock oscillator in which a tone signal with a memorized waveform as derived is amplified electronically to feed a loud speaker, thus not requiring a number of tone oscillators as well as a number of filters for processing tone signals of desired complex waveforms.

A further object of the present invention is to provide a waveform producing system in, for example, an electronic musical instrument comprising tone envelope waveform memorizing means in its tone gate circuit, namely, in its tone keyer circuit, said means including an attack envelope memory memorizing a build-up portion of the envelope waveform and a decay envelope memory memorizing a down-slope portion of the envelope waveform and envelope waveform read-out means for detecting the depression and release of a key to thereby derive a corresponding envelope waveform from the memorizing means, which makes it possible to obtain a tone signal having a complicated envelope waveform resembling those of natural musical instruments by a simple construction and to adjust time intervals of the build-up portion and the down-slope portion of the envelope waveform as desired.

A still further object of the present invention is to provide a specific waveform producing device having waveform memory therein, which is useful particularly for electronic musical instruments, in which the interlacing rate of a memorized waveform, i.e. the sampling frequency thereof is variable with an increase in frequency of the narrow band basic signals, whereby producing required wide band frequency signals without actively raising a quantized noise frequency.

A further object of the present invention is to provide a waveform producing system in, for example, an electronic musical instrument provided with tone control signal producing means including a waveform memory for memorizing amplitude variations with respect to time or depression speeds of a key, and arranged to be operative so that, upon depression of a specific key, a tone control signal corresponding to its depression speed is read-out for controlling the amplitude, frequency, tone color and phase of a tone signal, whereby a touch-responsive tone control signal is obtained.

Yet a further object of the present invention is to provide a novel construction of a tone generator and/or a large number of tone control circuits, which is suitable for circuit integration, and is easy to manufacture on a mass-production basis and is not expensive, and does not require a large capacity capacitor and a coil.

Another object of the present invention is to provide a waveform producing system in, for example, an electronic musical instrument which has a solid-state circuit arrangement in its sound production system such as a tone generator and tone keyers and a power amplifier including a tone processing waveform memory.

In accordance with the present invention, there is provided a waveform producing sytem comprising: a waveform memory having resistive voltage divider networks for memorizing a waveform in such a manner that the waveform is divided into a plurality of amplitude elements with respect to time and each amplitude element is set to correspond to the division ratio of each divider; a read-out means including a plurality of frequency divider circuits which are so arranged to be interchangeably cascaded for producing sampling pulses and for providing the pulses to said memory to sample (scan) the memorized waveform; clock signal generator means adapted to generate clock signals to drive the frequency divider circuits; and frequency divider connection change-over means disposed between said clock signal generator means and said read-out means to variably control the cascaded connections of the frequency divider circuits in accordance with the clock frequency of the clock signal delivered from the generator means so that the sampling number for the memorized waveform is reduced with an increase in the frequency of the applied clock signal to maintain the sampling frequency substantially constant.

These as well as other objects, features and advantages of the present invention will be well understood from the following detailed description made in conjunction with the accompanying drawings.

BRIEF DESCRIPTION OF THE DRAWINGS

FIG. 4*a* is a circuit diagram illustrating an example of each waveform memorizing means as shown in FIG. 2, which constitutes the construction of an essential portion of the present invention, whereas

FIG. 8*a* is a schematic block diagram illustrating a waveform producing system applied to an electronic musical instrument which is similar to the embodiment of FIG. 1, whereas FIGS. 8*b*–8*d* show graphs for explaining the operation of the system shown in FIG. 8*a*, respectively.

FIG. 9*a* is a schematic circuit diagram illustrating another embodiment of waveform producing system which is much improved from that of FIG. 8*a*, while FIGS. 9*b*–9*d* are graphs for explaining the operation of the system of FIG. 9*a*.

FIGS. 12*a*–12*d* are diagrams for explaining the operation of the system shown in FIG. 9*a*.

FIG. 17*a* is a view illustrating an example of a waveform memorizing means used in FIG. 14, whereas

It should be understood that like reference numerals and symbols indicate like parts throughout the drawings.

DETAILED DESCRIPTION OF THE PREFERRED EMBODIMENTS

Figure 1:
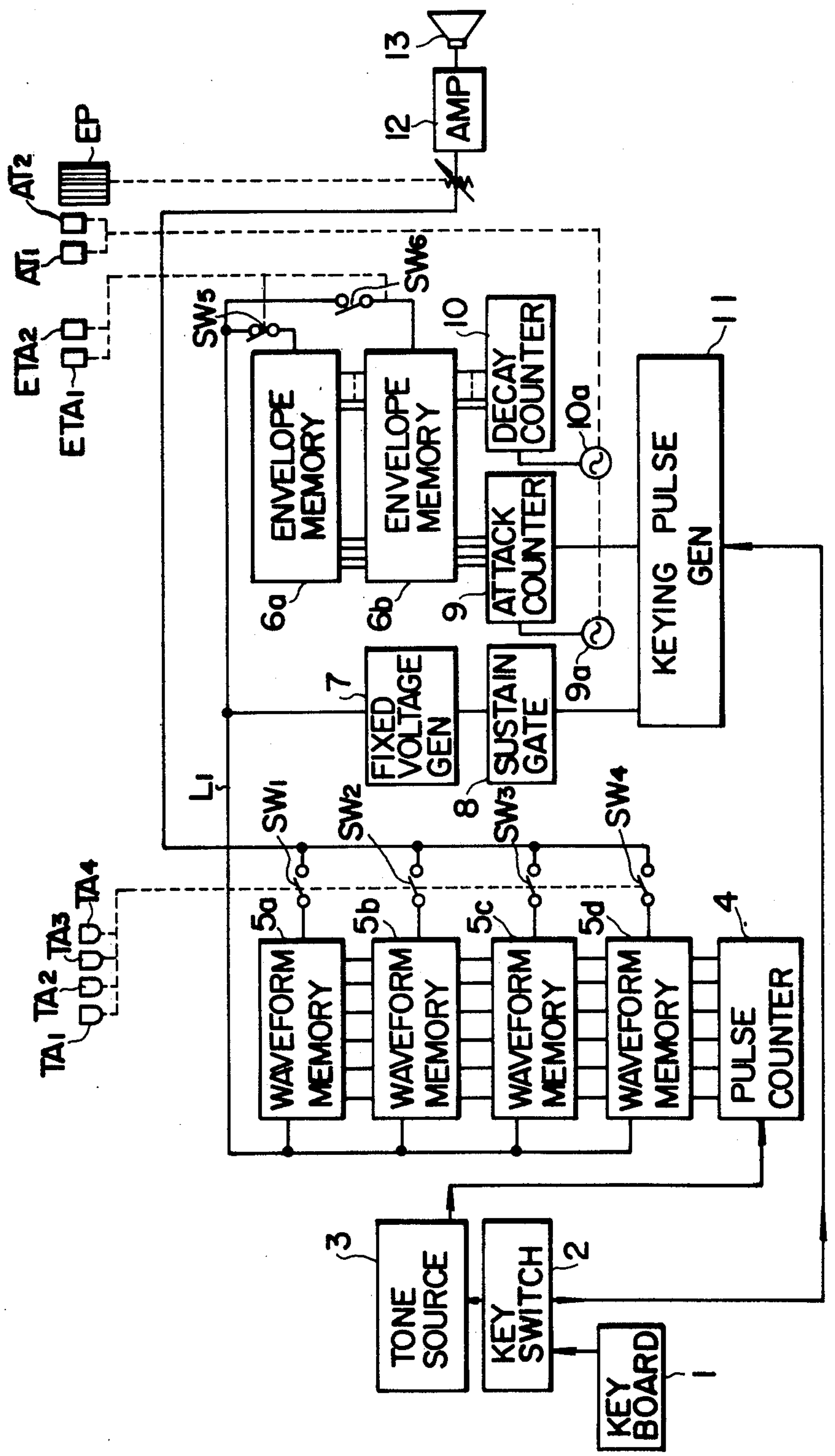
FIG. 1 is a schematic block diagram of an embodiment of an electronic musical instrument in accordance with the present invention.

Referring now to FIG. 1, there is schematically illustrated an embodiment of an electronic musical instrument in accordance with the present invention, in which numeral 1 denotes a keyboard, 2 a key switch circuit section, 3 a tone source circuit section, 4 a pulse counter, 5*a*-5*d* tone waveform memories, 6*a* and 6*b* tone envelops waveform memories, 7 a fixed voltage generator, 8 a sustain gate, 9 an attack counter, 10 a decay counter, 11 a keying pulse generating circuit, 12 an audio amplifier, 13 a loudspeaker, $TA_1$-$TA_4$ tone color tablets, $AT_1$ an attack control knob, $AT_2$ a decay control knob, EP an expression pedal, $SW_1$-$SW_4$ tablet-actuated switches, $SW_5$-$SW_6$ an attack knob-actuated switch and a decay knob-actuated switch, respectively, and 9*a* and 10*a* an attack knob-operated pulse generator for the attack counter and a decay knob-operated pulse generator for the decay counter, respectively.

Envelope waveform memories 6*a* and 6*b* are provided to memorize an attack portion and a decay portion of a tone envelope waveform characteristic, respectively, while the fixed voltage generator 7 is provided to generate a constant voltage which works as a flat sustain portion of the envelope characteristic. These memories 6*a* and 6*b* are so constructed to deliver a memorized envelope waveform signal to a tone signal control side upon receipt of pulse signals from the attack counter 9 and the decay counter 10. The envelope waveform memories 6*a* and 6*b* are selectively operated by a selective operation of the envelope tablets $ETA_1$ and $ETA_2$ thereby to close either one of the switches $SW_5$ and $SW_6$. Only for the convenience of explanation, description will be made hereunder of the case of operating the attack envelope memory 6*a*.

The keying pulse generating circuit 11 functions to control each of the attack counter 9 and decay counter 10 and the sustain gate 8 by the receipt of a keying pulse signal. That is to say, the circuit 11 makes the attack counter 9 operative to read-out an attack envelope waveform memorized in the memory 6*a* upon a key-operated switch being in its "on" state, and turns "on" the sustain gate 8 upon completion of counting by the counter 9 to develop a constant DC voltage from the fixed voltage generator 7 and then makes the decay counter 10 operative to read-out a decay envelope waveform memorized in the memory 6*b* when an "off" action of the key-operated switch is detected. Thus, a voltage representing the memorized envelope waveform is delivered to a line $L_1$ and is applied to the tone waveform memories 5*a*-5*d* from the envelope memories 6*a* and 6*b* and the fixed voltage generator 7. Each of the tone waveform memories 5*a*-5*b* has a tone waveform memorizing function and if of a substantially like construction as that of each envelope memory.

The tone source circuit section 3 is provided with oscillators associated with key-actuated contact switches of the key switch circuit section 2, each of which is capable of producing $n \cdot f$ clock pulses per second when a corresponding contact switch of the key switch circuit section 2 is closed by the depression of a corresponding key of the keyboard 1, wherein $n$ represents an integer which corresponds to a sampling number of the waveform memory, and $f$ represents a number corresponding to the frequency of a required tone pitch, which is variable with each key. The produced clock pulses are delivered to an $n$-stage pulse counter 4, so that this counter 4 recirculates $f$ times per second to thereby produce output pulses at its output side. These output pulses are then applied to the tone waveform memories 5*a*-5*d* which each memorizes a preset tone waveform to read-out the memorized tone signal waveforms. By a selective operation of tone color tablets $TA_1$-$TA_4$, any of the switches $SW_1$-$SW_4$ is interlockingly closed so as to select a required tone color or colors, and the thus derived tone signals are delivered from the tone waveform memories to the audio amplifier 12.

Now, let us assume that one switch $SW_1$ is closed. Whereupon, tone signals are successively read out from the corresponding waveform memory 5*a*, and they are subjected to tone envelope control by a tone envelope signal through the line $L_1$, and then are amplified by the audio amplifier 12 and reproduced by the loudspeaker 13.

Alternatively, it will be understood that those read-out tone signals derived from the tone waveform memories 5*a*-5*d* may be keyed by using the conventional tone keyer circuit so as to provide a tone envelope effect, as another aspect of the present invention.

Figure 2:
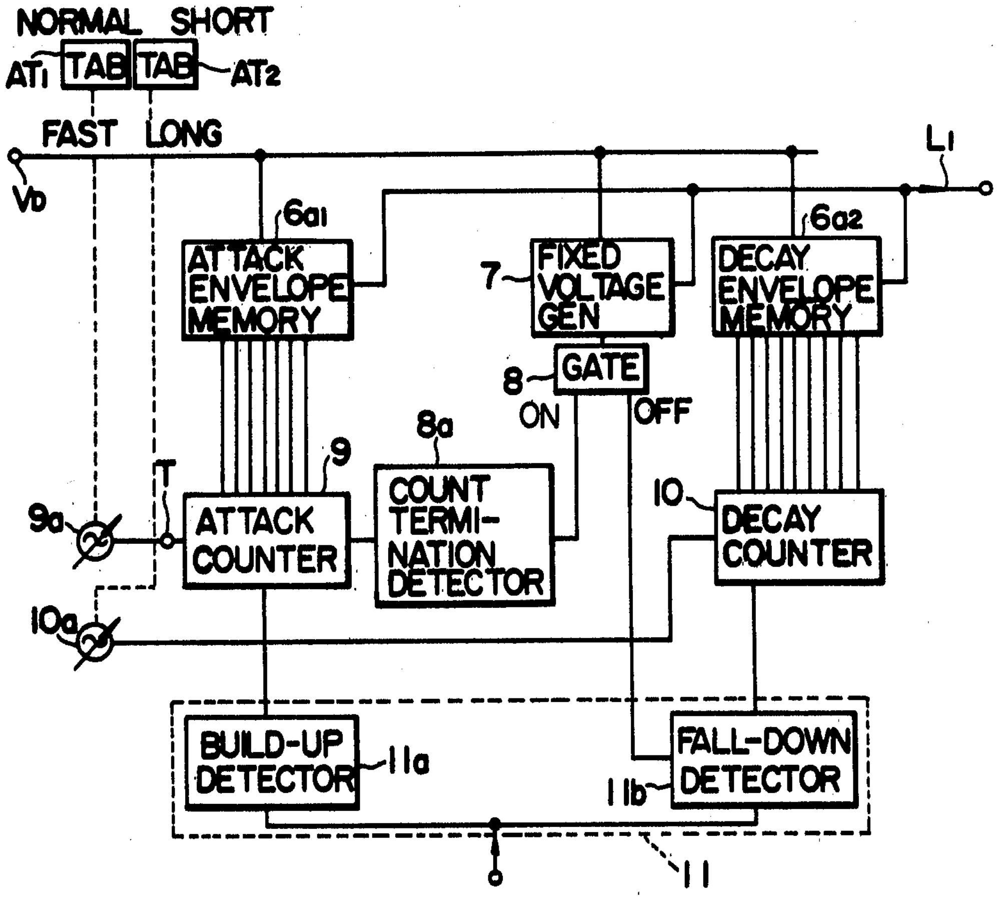
FIG. 2 is a schematic block diagram illustrating details of the tone envelope read-out means shown in FIG. 1.

Referring to FIG. 2, there is shown a detailed block circuit diagram of an envelope memory 6*a* and keying pulse generating circuit 11 as shown in FIG. 1, in which the memory 6*a* is indicated to include an attack envelope memory $6a_1$ and a decay envelope memory $6a_2$, and the pulse generating circuit 11 is indicated to have a build-up pulse detector 11*a* and a falling pulse detector 11*b*.

Figures 3A, 3B, 3C, 3D, 3E, 3F, 3G, 3H, 3I, 3J:
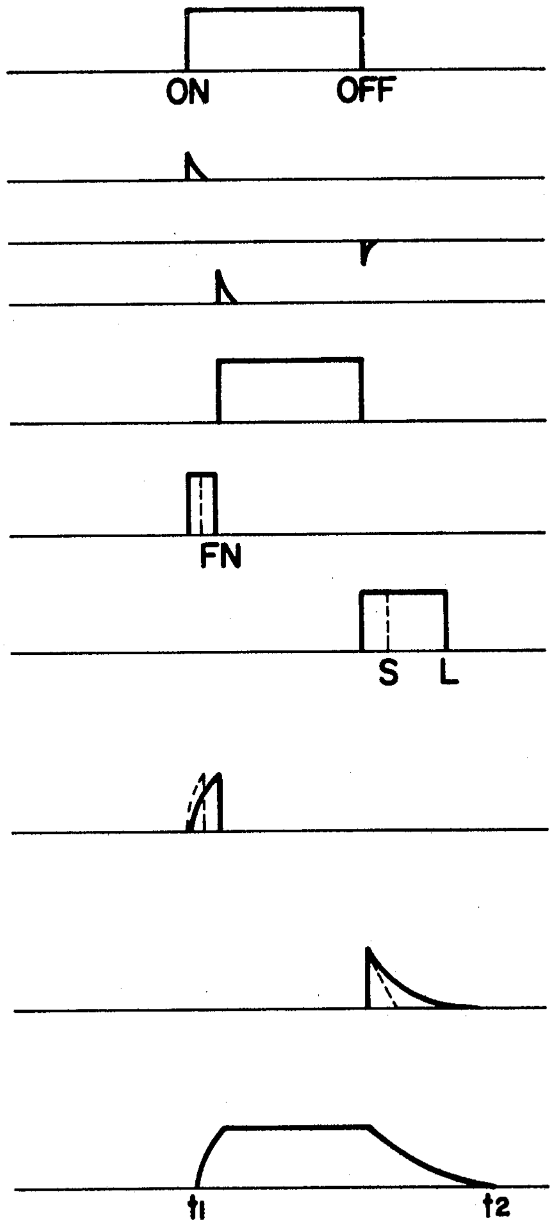
FIGS. 3(*a*)–(*j*) are diagrams illustrating waveforms associated with the blocks shown in FIG. 2.

Description will hereunder be made of the operation for obtaining an envelope control signal voltage by the arrangement of FIG. 2 with reference to the graphs of FIG. 3 which depict various waveforms at each part of this arrangement.

When a keying pulse signal having a waveform of FIG. 3(*a*) is applied to the keying pulse generating circuit 11, a build-up pulse as shown in FIG. 3(*b*) is produced by the build-up signal detector 11*a*, and is applied to the attack counter 9 to initiate the operation of the counter. An output pulse derived from the counter 9 is applied to the attack envelope memory $6a_1$, thereby reading out or deriving a voltage of the memorized attack envelope from the memory $6a_1$. At the termination of counting of the attack counter 9, a pulse which is representative of the termination of counting is generated by a count termination detector 8*a*, which pulse has a waveform as shown in FIG. 3(*d*), and turns the sustain gate "on" to thereby develop a DC voltage of a constant amplitude as shown in FIG. 3(*e*) in the fixed voltage generating circuit 7. Subsequently, when the key-operated switch is turned "off", a falling (negative going) pulse as shown in FIG. 3(*c*) is produced by the falling pulse detector 11$b$. The falling pulse causes the sustain gate 8 to be turned "off", thus stopping the generation of the fixed amplitude voltage at the generator 7, and simultaneously it is applied to the decay counter 10 to thereby initiate the operation thereof. Thus, count signals from the decay counter 10 are applied to the decay envelope memory 6$a_2$ for reading the memory, so that a voltage representing a memorized decay envelope waveform as shown in FIG. 3(*i*) is read out at the memory 6$a_2$. Therefore, it will be seen that, by the depression and release action of the key, an envelope representing a voltage having the entire rise and fall waveform shown in FIG. 3(*j*) is produced serially with respect to a time interval between $t_1$ and $t_2$.

It should be noted that the operation interval of the attack counter is variable through the range of from fast point F to normal point N as shown in FIG. 3(*f*) as required by changing the oscillation frequency of a clock oscillator 9$a$ for driving the attack counter, while the operation interval of the decay counter is also variable through the range between short point S and long point L as shown in FIG. 3(*g*) as required by varying the oscillation frequency of another clock oscillator 10$a$ for driving the decay counter.

Figure 4A:
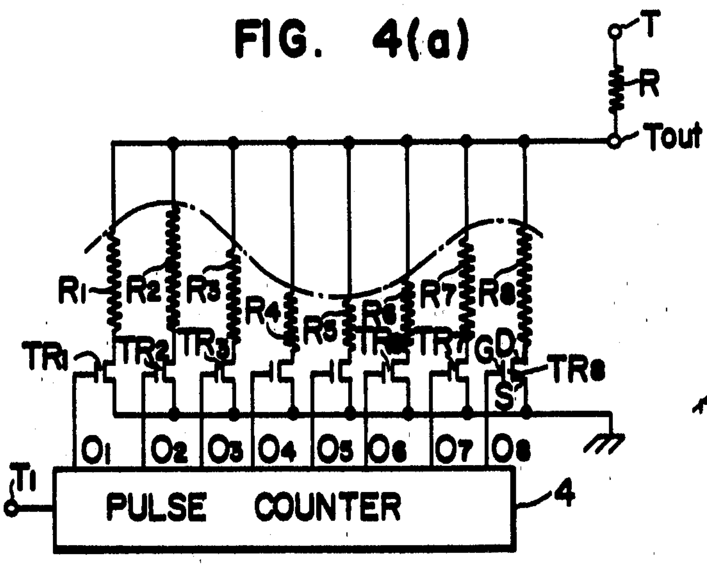
Figure 4B:
FIG. 4*b* is a view showing a waveform memorized in the memorizing means of FIG. 4*a*.

FIG. 4(*a*) illustrates the detail of each of the above-mentioned waveform memories. By way of example, a circuit arrangement applied to either one of the tone waveform memories 5$a$–5$d$ is described hereunder. However, such an arrangement is, of course, applicable to the above-mentioned attack envelope memory or decay envelope memory in a similar manner as in the case of each tone waveform memory, though not described in detail, $R_1$ through $R_8$ denote resistors, the resistances of which are set to be in correspondence with sampled (scanned) amplitudes of the waveform to be memorized. In this drawing, each resistance value is indicated by the length of the resistor simply for the purpose of illustration only. One ends of the respective resistors $R_1$ to $R_8$ are connected to a common line which in turn is connected through a load resistor R to a terminal T to which a power voltage is applied. The connection point T*out* between the load resistor R and the common line constitutes an output terminal. Though an envelope control voltage derived from the envelope waveform memories is applied to the terminal T*out* as will be seen from FIGS. 1 and 2, it is assumed hereinafter that a constant amplitude voltage as the envelope control voltage is imparted to the terminal merely for the simplicity of explanation. The other ends of the resistors $R_1$ to $R_8$ are connected to switching elements such as field-effect transistors $TR_1$ through $TR_8$ at their drain electrodes, respectively, the source electrodes S of which are commonly grounded and the respective gates G of which are connected respectively to output terminals $O_1, O_2 \ldots O_8$ of the pulse counter 4. In the waveform memory arrangement, when a predetemined nunmber of clock pulses as a source signal are applied to an input terminal $T_1$ of the counter 4 from the tone source circuit section 3, a pulse voltage is developed at the terminals $O_1, O_2 \ldots O_8$ sequentially and thus is shifted at these output terminals in recirculation. Accordingly, if a pulse voltage is present at the terminal $O_1$ and is applied to the gate of the transistor $TR_1$, the latter is rendered conductive, so that a current flows through a path composed of: terminal T, load resistor R, resistor $R_1$, the drain and the source electrodes of the transistor $TR_1$ and ground, thus deriving a DC voltage in value corresponding to the resistance of the resistor $R_1$ at the output terminal T*out;* that is to say, reading out a part of a waveform memorized in the form of resistance at that terminal. When the pulse voltage is present successively at the terminals $O_2, O_3 \ldots O_8$ and when these voltages are applied to the respective gates of transistors $TR_2, TR_3 \ldots TR_8$, voltages representative of the corresponding resistors $R_2, R_3 \ldots R_8$ are developed at the output terminal T*out* successively in a similar way as that described previously. These voltages appearing at the output terminal T*out* are indicated with respect to time as a waveform shown in FIG. 4(*b*). From this fact it will be apparent that a tone signal waveform as required can be made to appear at the output terminal T*out* by appropriately setting the resistance value of each resistor as memorizing element.

Figure 5:
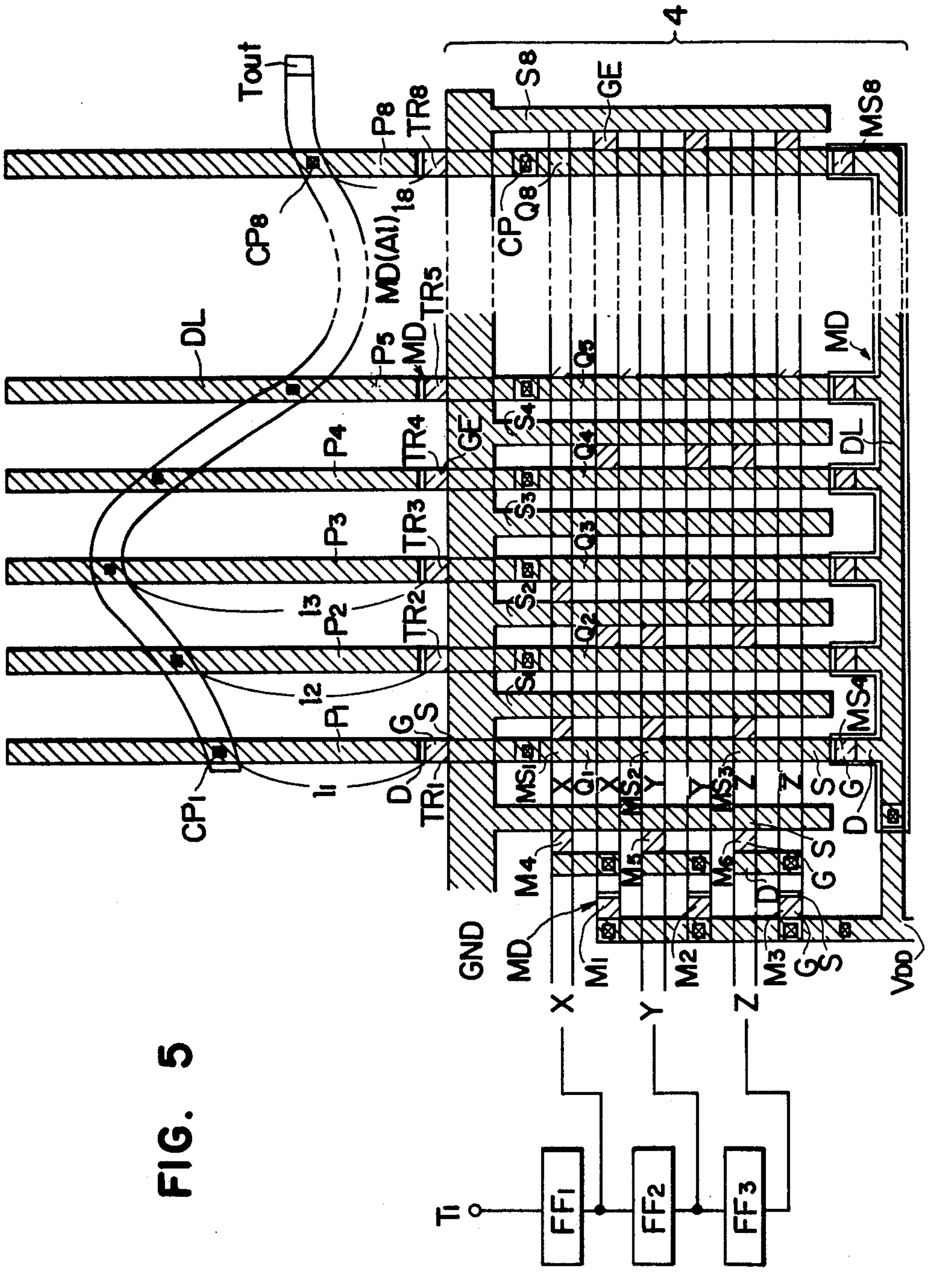
FIG. 5 is a schematic constructional view illustrating an example of a semiconductor integrated circuit forming the circuit arrangement shown in FIG. 4*a*.

FIG. 5 illustrates schematically a plan view of an integrated circuit of the waveform memory shown in FIG. 4, in which example, let us assume that an MOS (metal-oxide-semiconductor) is used as the integrated circuit, and also that p-channel field-effect transistors are used as transitors for the convenience of explanation. In this drawing, DL represents p-type diffused layers, GE gate electrodes of MOS transistors, MD metal-deposited regions, and CP connections between the metal deposition regions and the p-type diffused layer. In a semiconductor substrate, a plurality of p-type diffused regions $P_1, P_2 \ldots P_8$ are buried, and they form resistors of strip shape. Each resistive strip is interconnected with an aluminum-deposited layer at such a position as will constitute a resistance corresponding to an analog quantity of a waveform to be memorized. Namely, the lengths $l_1, l_2 \ldots l_8$ of the p-type diffused regions $P_1, P_2 \ldots P_8$ are set to be in correspondence with the sampled (scanned) amplitudes of an analog waveform, and hence these diffused regions have resistance values in accordance with the lengths thereof, respectively, of which the lower ends are connected to the drain regions of the MOS p-channel field-effect transistors $TR_1, TR_2 \ldots TR_8$, respectively. Transistors $TR_1$ to $TR_8$ are so constructed as to be rendered conductive by receiving a pulse (negative) voltage being applied to each gate thereof from the pulse counter 4. Accordingly, if a negative going pulse which has a sufficient magnitude to render the transistors $TR_1, TR_2 \ldots TR_8$ conductive is applied to the gate electrodes thereof from the counter 4 successively, these transistors are also rendered conductive only during the period in which the successive pulses are supplied to each gate, rendering these transistors "on-off" successively. The common connection line of the aluminum-deposited layer with the resistor array is connected through the load resistor R having a suitable resistance value to a negative power souce, though not shown, and hence, output voltages corresponding to the lengths $l_1, l_2 \ldots l_8$ of the p-type diffused regions $P_1, P_2 \ldots P_8$ are successively derived or read out at the terminal T*out* of the aluminum-deposited layer Al. It will be seen that the lengths $l_1, l_2 \ldots l_8$ of the regions $P_1, P_2 \ldots P_8$ correspond to the resistors $R_1, R_2 \ldots R_8$ as shown in FIG. 4(*a*). In FIG. 5, the pulse counter 4 is indicated as a structure of an integrated circuit. The p-type diffused resistive layers are used as souce electrodes and drain electrodes of MOS field-effect transistors and as interconnections.

Figure 6:
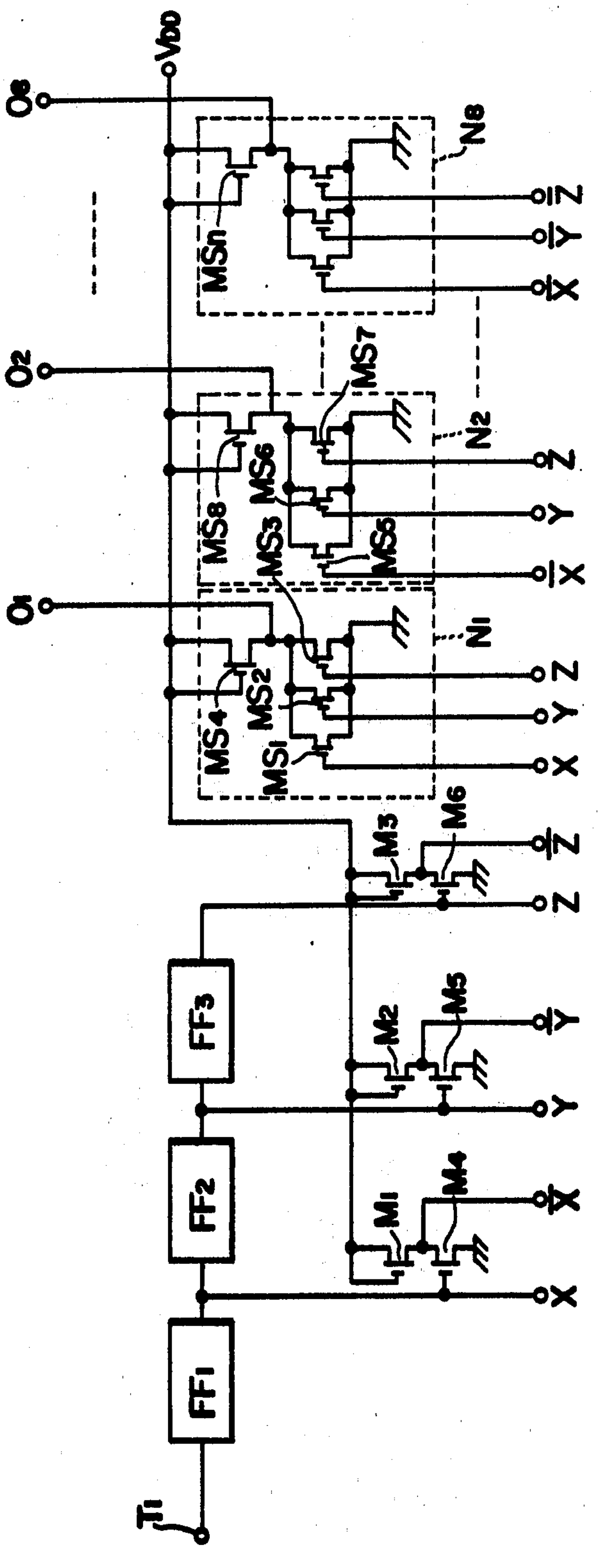
FIG. 6 is an equivalent circuit diagram of a waveform read-out means or a pulse counter shown in FIG. 4*a*.
Figure 7:
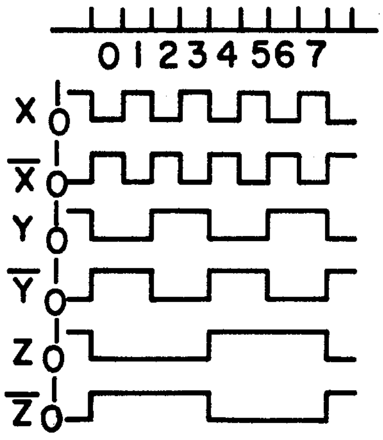
FIG. 7 is a graph showing waveforms at each portion as shown in FIG. 6.

The equivalent circuit of the pulse counter 4 in FIG. 5 is as shown in FIG. 6, which circuit has three cascaded flip-flops $FF_1$, $FF_2$ and $FF_3$. The first flip-flop $FF_1$ is provided with the input terminal $T_1$ to which a series of clock pulses are applied from the tone source circuit section 3. Consequently, the respective outputs X, Y and Z of the flip-flops $FF_2$, $FF_2$ and $FF_3$ present waveforms as shown in FIG. 7. $M_1$, $M_2$ . . . $M_6$ denote p-channel MOS field-effect transistors which function to produce inverted outputs $\overline{X}$, $\overline{Y}$ and $\overline{Z}$ from the outputs X, Y and Z of the flip-flops, and $MS_1$, $MS_2$ . . . $MS_n$ (for example $MS_8$) denote MOS field-effect transistors which function to produce an output signal for driving the gate electrodes of transistors $TR_1$, $TR_2$ . . . $TR_8$ in accordance with these signals X, Y and Z and $\overline{X}$, $\overline{Y}$ and $\overline{Z}$. Transistors $MS_1$ through $MS_n$ are constructed so that a multiplicity of parallelly arranged p-type diffused layers $Q_1$, $Q_2$ . . . $Q_8$ and $S_1$, $S_2$ . . . $S_8$ may be disposed in interleaved comb-shape to one another and adjacent layers $Q_1$ and $S_1$, $Q_2$ and $S_2$ . . . $Q_8$ and $S_8$ are combined, respectively. Between each adjacent layers a thin oxide film is formed though not shown, and an aluminum film is deposited thereon so that layers $Q_1$, $Q_2$ . . . $Q_8$ serve as the drain portion and layers $S_1$, $S_2$ . . . $S_8$ as the source portion and the aluminum film as the gate portion.

Referring to the circuit of FIG. 6, transistors $MS_1$ through $MS_4$ constitute a logical NOR circuit $N_1$, wherein when its input signals X, Y and Z are concurrently zero, "1" signal having a negative voltage appears at the terminal $\mathbf{0}_1$. To the other terminals $\mathbf{0}_2$ to $\mathbf{0}_8$, similar NOR circuits $N_2$ to $N_8$ are connected. The following table shows the relationship between the inputs for NOR circuits and the count outputs appearing at terminals $\mathbf{0}_1$ to $\mathbf{0}_8$:

Table

| INPUT TERMINAL \ INPUT | X Y Z | $\overline{X}$ Y Z | X $\overline{Y}$ Z | $\overline{X}$ $\overline{Y}$ Z | X Y $\overline{Z}$ | $\overline{X}$ Y $\overline{Z}$ | X $\overline{Y}$ $\overline{Z}$ | $\overline{X}$ $\overline{Y}$ $\overline{Z}$ |
|---|---|---|---|---|---|---|---|---|
| $0_1$ | 1 | 0 | 0 | 0 | 0 | 0 | 0 | 0 |
| $0_2$ | 0 | 1 | 0 | 0 | 0 | 0 | 0 | 0 |
| $0_3$ | 0 | 0 | 1 | 0 | 0 | 0 | 0 | 0 |
| $0_4$ | 0 | 0 | 0 | 1 | 0 | 0 | 0 | 0 |
| $0_5$ | 0 | 0 | 0 | 0 | 1 | 0 | 0 | 0 |
| $0_6$ | 0 | 0 | 0 | 0 | 0 | 1 | 0 | 0 |
| $0_7$ | 0 | 0 | 0 | 0 | 0 | 0 | 1 | 0 |
| $0_8$ | 0 | 0 | 0 | 0 | 0 | 0 | 0 | 1 |

As will be understood clearly from the foregoing statement, it is recognized that, when pulses are applied successively to the counter 4, count output signals are derived sequentially from the terminals $\mathbf{0}_1$ to $\mathbf{0}_8$.

Though the pulse counter 4 has been described with respect to a specific embodiment, counters of any other type may be used provided that they have such a function that output pulses are produced in succession at successive output terminals in accordance with the inputting of pulses. Through FIGS. 4–7, there has been described an embodiment of a tone waveform memory and a counter for driving the memory to read out or extract the memorized waveform. However, the combination of the attack envelope waveform memory with its attack counter, or the combination of the decay envelope memory with its decay counter can be manufactured in a similar construction to that of the preceding embodiments.

Thus, the electronic musical instrucment which employs various waveform memories as tone generators and tone envelope effect producing means as mentioned above is quite advantageous in that it is capable of producing tone signals each having a desired complicated and delicate waveform with tone envelope effects which really resembles that of a natural musical instrument, and in that the instrument makes it possible to arbitrarily adjust, in a simple manner, the time interval of the build-up portion or the decay portion of the tone envelope.

Figures 8A, 8B, 8C, 8D:
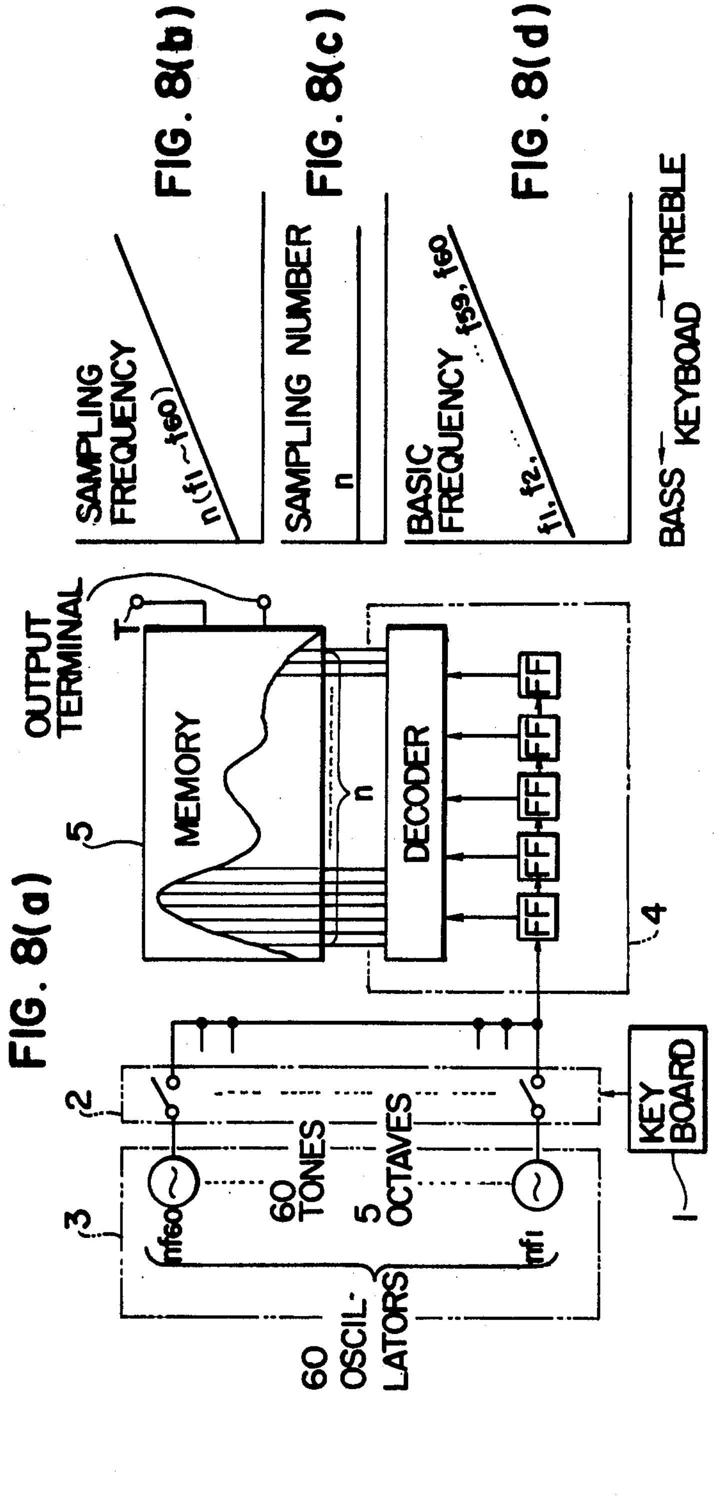

Now, an analytic discussion will be made of a waveform producing apparatus utilizing a waveform shaping technology using memories, which can appropriately be applied to accomplish the purposes of electronic musical instruments. First, the tone signal generators of the preceding embodiment are illustrated as a waveform producing apparatus as shown in FIG. 8(*a*). The tone source circuit section 3 has a plurality of clock pulse oscillators, each of which is capable of generating $n.f.$ clock pulses per second when a corresponding key of keyboard 1 is depressed so that a corresponding one of the key-actuated switches 2 is closed to a conducting position, wherein $n$ represents an integer which corresponds to the sampling number of a waveform memorized into waveform memories 5, while $f$ represents a fundamental frequency of a required tone pitch corresponding to the key's name. The clock pulses thus generated are delivered to a frequency divider circuit which comprises cascaded flip-flops and then they are delivered to a decoder at $n$-input terminals at which are sequentially developed pulse signals. Thus, the frequency divider circuit and the decoder, in combination, constitute an $n$-stage successive pulse generator 4, which therefore, recirculates $f$ times every second to produce pulses at its output side. Each of the waveform memories 5 comprises a bank of parallel-connected resistors with indvidual serial-connected electronic switching elements, each resistor being adapted to be connected with a common load resistor to constitute a voltage divider circuit in cooperation with the switching element, the dividing ratio of which is set so as to correspond to one sampling element of a waveform which is to be memorized into the memory with respect to a time axis. The voltage divider circuit is constructed so as to be operative so that, by receiving a pulse at the switching element, the switching element is rendered to the conducting state, and that as a resuh, the sampling element is derived in the form of a divided voltage at the output terminal of the memory. As has been described in the preceding embodiment, the waveform producing apparatus of this type has a number of advantages, for example, realistic tone signals can be provided easily without requiring a multiplicity of tone oscillators and filters, and tone color waveforms of a natural musical instrument can be memorized easily, as compared with conventional electronic musical instruments.

However, the above-mentioned waveform producing apparatus is somewhat inconvenient and a further development is desired since the apparatus requires individual oscillators corresponding in number to that of the keys of the keyboard for generating signals of the separate individual "basic" frequencies (as in tone-generators of an electronic musical instrument which will be clear from the drawings) and, therefore, 60 oscillators have to be installed for obtaining, for example, five octave tones. In that case, if the frequency $n \cdot f_1$ of the lowest tone is 65 $\times$ $n$Hz, the frequency $n \cdot f_{60}$ of the highest one will be approximately 2000 $\times$ $n$Hz. When a signal of a frequency as specified by one of the oscillators is supplied to the above-mentioned frequency divider circuit from the specified one oscillator, there are developed successive pulses at the respective $n$-output terminals of the decoder in the successive pulse generating circuit 4, so that the corresponding waveform elements—which are memorized in the waveform memory 5 in such a manner that a waveform is divided into $n$-amplitude elements with respect to a time axis—may be read out successively. In other words, it will be understood that the sampling number $n$ of the waveform memorized in the waveform memory 5 and sampled (scanned) is fixed by the successive pulse generating circuit 4 due to the inherent characteristic thereof, namely, the sampling frequency $n \cdot f_1$, $n \cdot f_2 \ldots n \cdot f_{60}$ is proportional to the fundamental frequency $F_1, F_2 \ldots F_{60}$ of the signal supplied to the frequency divider circuit as illustrated in FIGS. 8($b$)–8($d$). Therefore, in such an arrangement, when the memorized waveform is read out by a higher frequency signal of a "basic" frequency band, the sampled (scanned) waveform output includes not only audible harmonics but also higher harmonics exceeding the upper limit of the audible frequencies in reproduction, and so the reproduction of such higher harmonics is altogether useless for the required sound components to be reproduced. In further detail, it is well known that in accordance with the sampling theorem equi-spaced data, in which there are two or more points per cycle of the highest frequency, there is permitted reconstruction of band-limited functions, in other words, a waveform is sampled (scanned) by $n$-divisions. The sampled (scanned) waveform is not permitted to contain any higher harmonics than that of $n/2$ -order when reconstructed. Thus, it will become necessary to take into account the requirements for the "basic" frequency band and the sampling number to obtain a desired sampled (scanned) waveform which may contain harmonics of up to $n/2$ order which is within an audible frequency band.

On the other hand, when a waveform is sampled (scanned) or read out by a lower component of the fundamental "basic" frequency band, there occur step-noise frequency components or quantitized noise components of lower frequencies lying within an audible band. Consequenty, it is very undesirable that such a noise is unavoidably included in the reproduced sound. In addition, step-noise components of this kind are known to vary in proportion to the fundamental "basic" frequencies and are not constant, so that the unwanted components are ratherdifficult to be filtered away in an easy manner.

Accordingly, description will be made of another embodiment of the present invention, by referring to FIGS. 9–13, which is considered as a development of the preceding embodiment. Generally speaking, this embodiment is directed to a specific waveform producing apparatus provided with predetermined waveform memorizing means and successive waveform amplitude read-out means for variably sampling the amplitudes of the memorized waveform in such a manner that the sampling number is reduced with an increase in the "basic" fundamental frequency, namely, the amplitude of the memorized waveform is sampled (scanned) at a lower frequency as the "fundamental" frequency increases, so that the apparatus may produce a waveform covering the required wide band by using a "fundamental" signal source of a narrow band.

Figures 9A, 9B, 9C, 9D:
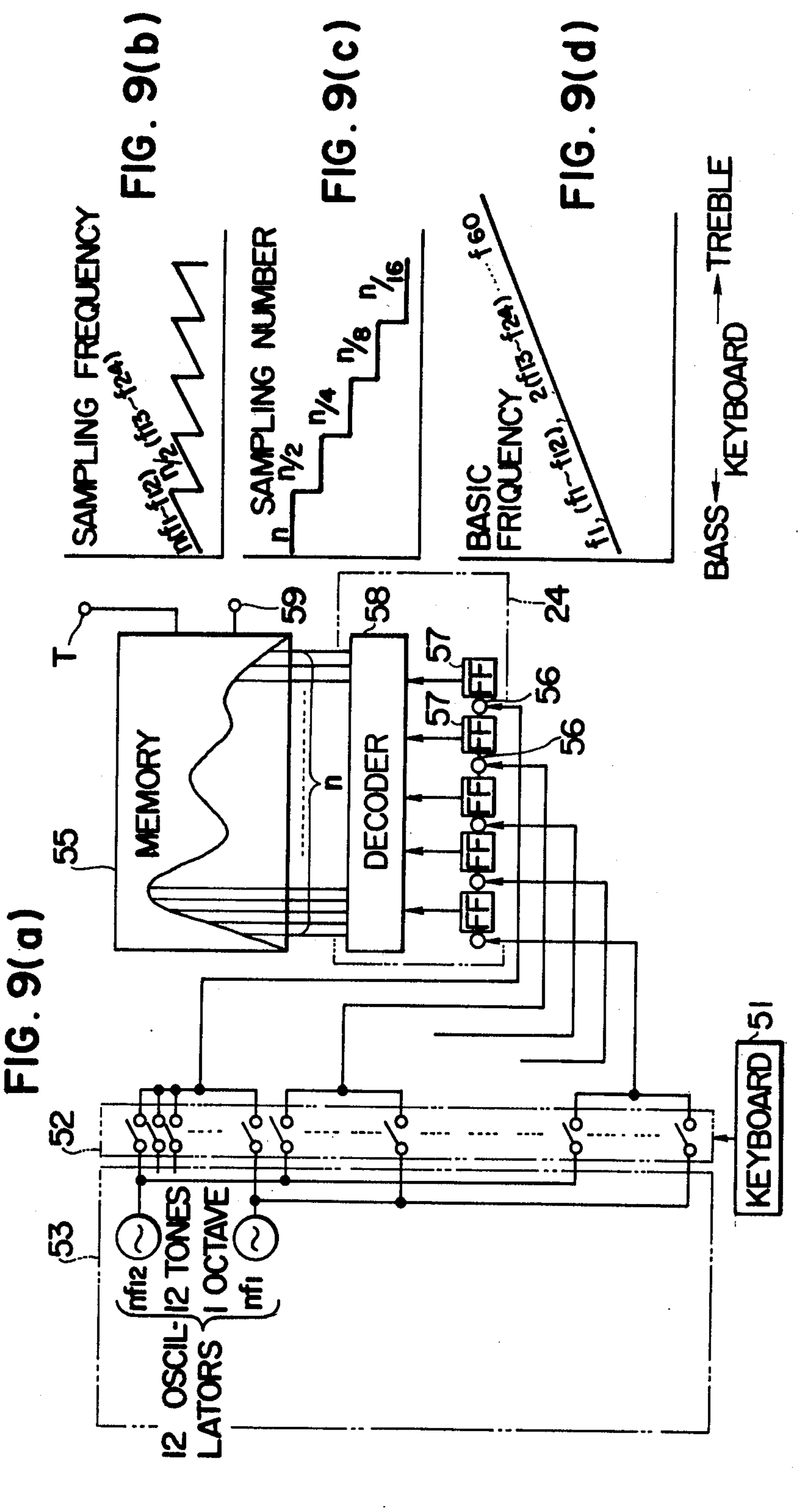

Referring to FIG. 9($a$), there is shown a circuit diagram of a waveform producing apparatus according to the present invention in contrast to that of FIG. 8($a$), in which reference numeral 51 denotes a keyboard, 52 key-actuated on-off contacts associated with corresponding keys of the keyboard, 53 a tone source having individual clock oscillators whose number corresponds to the number of one octave, 54 an $n$-stage successive pulse generator which is composed of a plurality of cascaded flip-flops 57 constituting a frequency divider circuit and a decoder 58, 56 an input stage selector provided between the clock oscillators and the successive pulse generating circuit and for changing-over the connection of the cascaded flip-flops to determine which of the flip-flops 57 are to be selectively cascaded and then to supply a clock pulse generated from an oscillator to the specified input terminal of the selected flip-flops, 55 waveform memories, and 59 an output terminal of the waveform producing apparatus at which each amplitude voltage of the memorized waveform is extracted in accordance with sampling of the waveform.

The tone source 53 produces a pulse signal representative of the corresponding one of the "basic" octaves upon depression of a corresponding key of the keyboard 51 to thereby close the associated one of contacts 52. The fundamental frequencies of the above-mentioned fundamental octave are selected by, preferably, 12 ones of from the lowermost frequency $n \cdot f_1 = 1000 \times n$Hz up to the uppermost frequency $n \cdot f_{12} = 2000 \times n$Hz, wherein $n$, $f_1$ and $f_{12}$ are as defined previously. The clock pulse signal thus produced is supplied to a specific one of the gates of the circuit 56. The normally opened stationary contact portions of contact 52 of each octave which are at the side of circuit 56 are connected at a common terminal, whereas the movable contact portions of contact 52 at the side of clock oscillators of which the associated key name is the same in every octave are commonly connected. Each common output terminal in each octave is connected to a corresponding one of the gates of the circuit 56 which are provided at the input terminals of the flip-flops 57, in such a manner that the number of the cascaded stages of flip-flops increases as the tone range in the tone source becomes lower.

As will be understood from the foregoing statement, the tone source described here is provided with extremely fewer clock oscillators than is the tone source described in connection with FIGS. 8($a$) and 8($b$) which is provided with clock oscillators corresponding in number to that of the keys of the keyboard. However, this tone source is connected in such a way that the same number of clock pulses are applied to the flip-flops 57 constituting a frequency divider circuit whenever every key of the same tone is depressed. Thus, when one key which is representative of a certain tone belonging to the lowest octave is depressed, the $n$-stage flip-flops are wholly rendered to the cascaded connection, and the first-stage thereof is supplied with clock pulses whose number corresponds to that of the depressed key, and accordingly, an output pulse is produced at the output terminals of all the stages. On the other hand, when another key which is representative of a certain tone belonging to the highest octave is depressed, the frequency divider circuit is operative only by the last one-stage, and hence it has only one operable output terminal. Here is described the use of a flip-flop for each stage of the frequency divider circuit merely by way of example and, therefore, a bit signal can be produced at an output terminal of each flip-flop, and the bit signal is adapted to be applied to the decoder 58 which generates successive pulses at the output ends.

Figure 10:
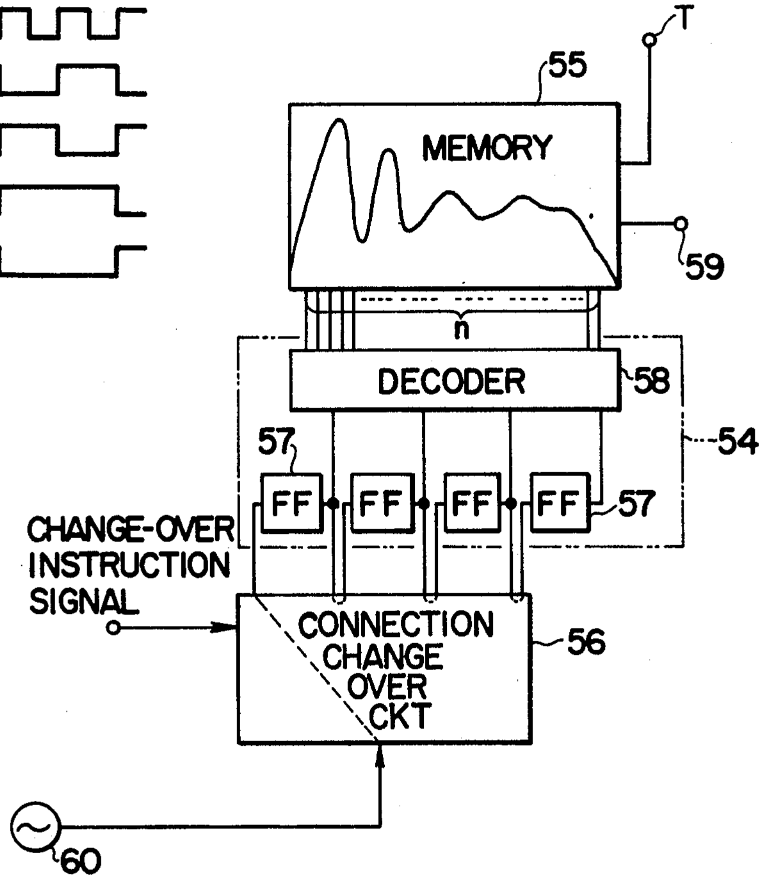
FIG. 10 is a functional block diagram illustrating the essential portion of the system of FIG. 9*a* in more detail.

FIG. 10 is a schematic illustration of the connection change-over circuit 56 in association with other interconnected circuits. As the connection change-over circuit 56, any circuit may be used provided that it has such functions that, upon receipt of a change-over instruction signal which is generated upon depression of a key and is specified by the name of the key, selected divider stages will make a cascaded connection, whose input terminal is set by said instruction signal.

Figure 11:
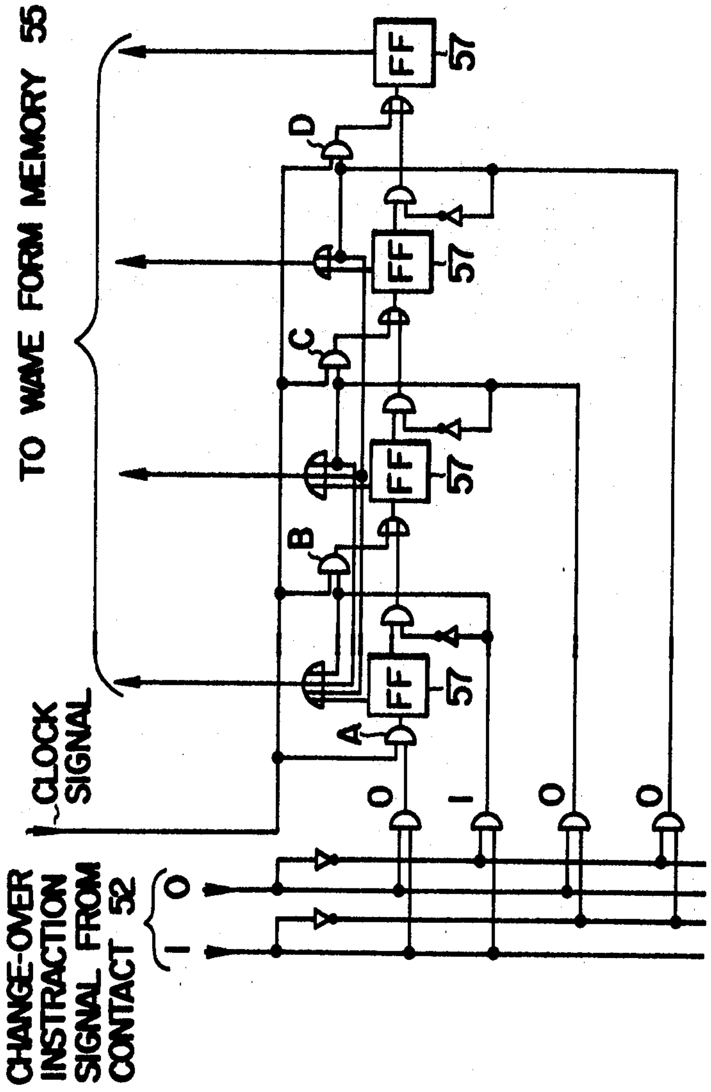
FIG. 11 is a circuit diagram illustrating an example of an essential part of FIG. 10 in detail.
Figure 13A:
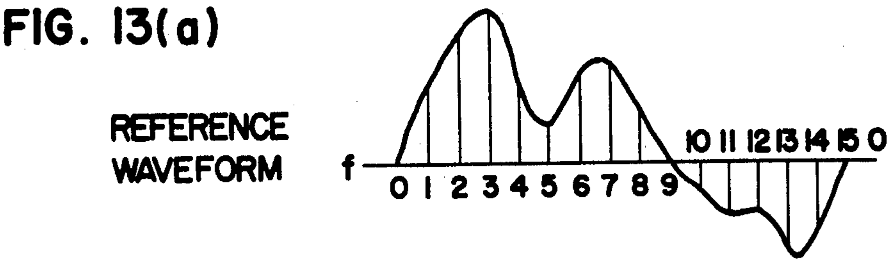
FIGS. 13*a*–13*d* are waveforms for explaining the output signal obtained from the waveform producing system of FIG. 9*a*.
Figure 13B:
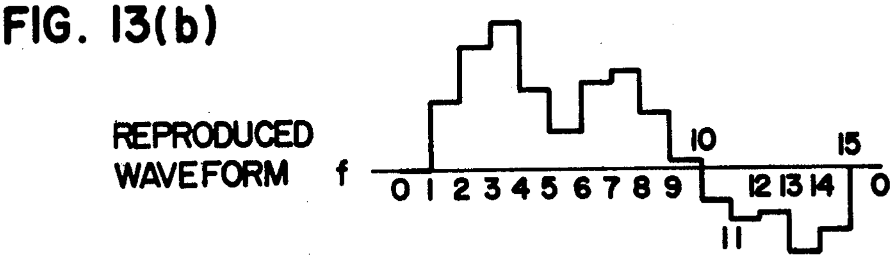
Figure 13C:
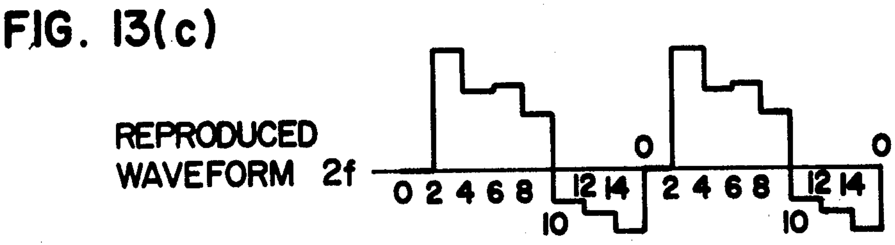
Figure 13D:
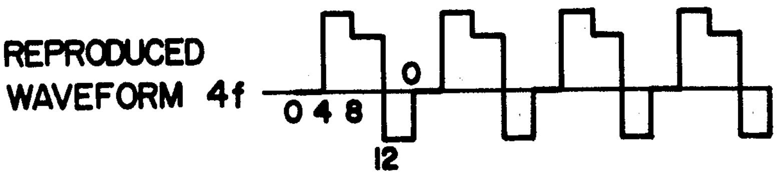

One example of the connection change-over circuit is shown in detail in FIG. 11. In this circuit, it will be noted that, if the change-over instruction signal is "1" or "0" for example, only AND circuit B is rendered to its "on" state of the AND circuits A, B, C and D and a clock signal is thereby inputted to a second flip-flop 57.

Now, it will be described in what sequence are pulses generated at the output terminals of the decoder in accordance with the pattern of the cascaded connection taken between the divider circuits 57 with reference to FIGS. 12(*c*)–12(*d*), under the assumption for the purpose of explanation that four flip-flops 57 are adapted to be cascaded and that at each output terminal the flip-flops a bit signal is fed to the decoder 58 and that the decoder 58 has fifteen serial output terminals.

When a clock pulse is inputted to a first-stage flip-flop in the circuit connection shown in FIG. 12(*c*), the flip-flops produce bit signals successively at their output terminals. The first, second, third and fourth outputs of the flip-flops constitute first bit, second bit . . . , fourth bit, respectively. The relation between the outputs of flip-flops and decoder are as illustrated in FIG. 12(*a*). Alternatively, when a clock pulse is inputted to a second-stage flip-flop in the circuit connection shown in FIG. 12(*d*), no input signal is applied to the first flip-flop, maintaining its output always at zero. Thus, the relation in output between the flips-flops and the decoder will be as shown in FIG. 12(*b*). From this, it will be understood that successive pulses appear at only even-number output terminals of the decoder. Needless to say, it is not always necessary in this instance for the output of the first-stage flip-flop to be rendered to zero. Instead of being rendered to zero, the first-stage flip-flop may be disconnected.

In a similar manner as described above, successive pulses can be derived at every $2^2$th, $2^3$th . . . output terminals of the decoder as clock pulses are inputted to the flip-flops in the later stages than the second stage.

The output terminals of the decoder 58 are provided in a number at least equal to the number *n* of the dividing elements of the waveform memorized in the waveform memory 55, wherein *n* is an integer. Accordingly, when successive pulses are produced at the respective output terminals of the decoder as shown in FIG. 12(*a*), the sampling number for the memorized waveform in the memory will be *n*, whereas when the successive pulses are produced at every other one output terminal of the decoder, the sampling number will be *n*/2. Therefore, if clock pulses are inputted to the later stage flip-flops one after another, that is to say, if the fundamental frequencies which correspond to the tones of the key name increase with each octave as shown in FIG. 9(*d*), the sampling number *n* will be reduced accordingly step-wise to *n*/2, *n*/4 . . . *n*/16 as shown in FIG. 9(*c*), so that the sampling frequencies may be rendered to lie in a predetermined range as shown in FIG. 9(*b*) irrelevant to the magnitude, i.e. higher or lower, of the fundamental frequencies of the respective octaves which are assigned to the keys of the keyboard.

The waveform memory 55 can be constructed in such a way as mentioned with reference to FIGS. 4(*a*), 4(*b*) and 8(*a*) for example. It will be easily understood that the output terminals of the decoder 58 are arranged to correspond to the output terminals $O_1$, $O_2$. . . $O_8$ of the pulse counter 4 shown in FIG. 4(*a*).

Referring now to FIGS. 13(*b*)–13(*d*), various sampled (scanned) or reproduced waveforms are illustrated, which are obtained by sampling a waveform memorized in the memory 55 with output pulses of the decoder 58 in a different sampling number relative to the reference number of the memorized waveform.

From the foregoing statement, it will be understood that the present invention provides a waveform producing apparatus which is useful for an electronic musical instrument, wherein in the reproduction of the memorized tone signal waveforms in a digital fashion or in the sampling of the waveforms to be extracted, there are provided only "basic" frequency oscillators which correspond in number to that of the tones contained in one octave and wherein the sampling number of the waveform is decreased stepwise with each higher octave so that its sampling frequency is maintained within a substantially certain range, whereby the reproduced tone signals efficiently contain the required audible frequency components. Though any sampled (scanned) waveform inevitably involves a step-noise, the above-mentioned waveform producing apparatus is not adversely affected thereby, because the sampling frequencies are within a relatively narrow band as compared with those of the conventional ones, and the step-noise exists within a constant range, for example, between 16 and 32 kHz, which accordingly is possible to be filtered. Even when such a noise is generated, no adverse influence is imparted to the required tones since the frequency components of the noise is out of the audible frequency band. This apparatus has a great advantage in that no invalid or useless high harmonics can be included in the sampled (scanned) waveforms. In further detail, if a fundamental frequency is 128 Hz and a sampling number is 128, reproduction is possible up to harmonics of 64 order, that is, the upper limit frequency of the sampled (scanned) waveforms becomes 128 Hz $\times$ 64 = 8192 Hz. On the other hand, when the "basic frequency" is 1 kHz and the sampling number is 16, the upper limit frequency will be 1 kHz $\times$ 8 = 8000 Hz. It is known that an electronic musical instrument in general will be satisfactory if it is capable of reproducing sounds, covering their higher frequency components to a range up to about 8 kHz. For this reason, it is possible to set the sampling frequencies at low values, so that the apparatus can be simple in construction and does not require any expansive wide band amplifiers for amplifying the reproduced tone waveform signals.

Figure 14:
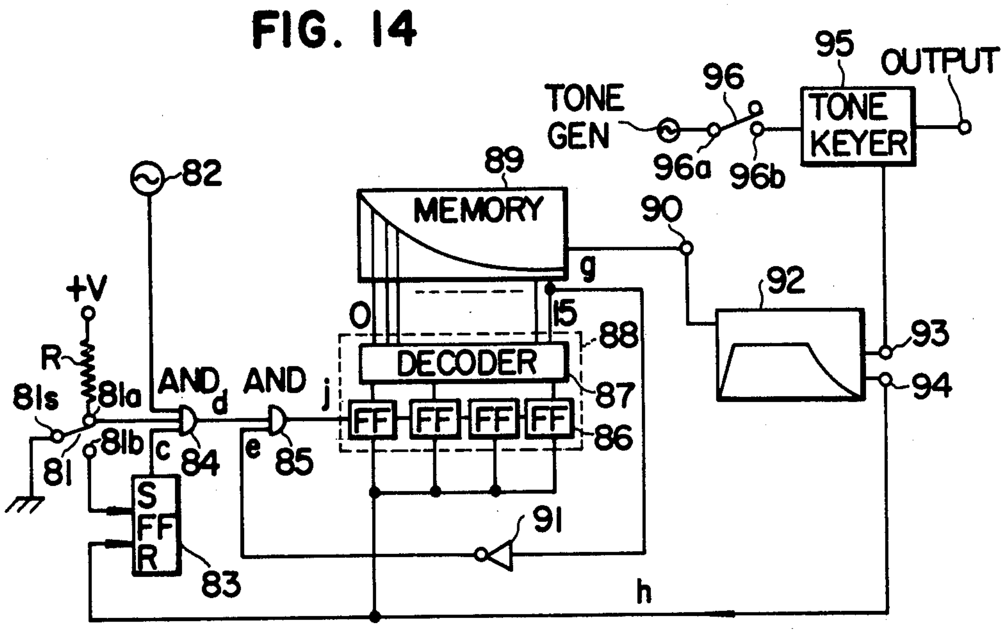
FIG. 14 is a schematic circuit block diagram illustrating a further embodiment of the present invention which is so constructed as to provide a touch-responsive effect to the electronic musical instruments.

Referring now to FIGS. 14–17, there will be described a further embodiment of the present invention, with respect to a "touch-responsive" tone level control circuit utilizing a memorized level function hereinbelow. FIG. 14 shows a block diagram of the essential portions according to the above-mentioned embodiment, in which reference numeral 81 denotes a key-actuated change-over switch, 82 a clock pulse generator, 83 a flip-flop, 84 and 85 an AND gate with three input poles and an AND gate with two input poles, respectively, 86 a cascaded flip-flop circuit constituting a frequency divider circuit, 87 a decoder associated with the flip-flop circuit to receive the signals delivered from this flip-flop circuit, thereby producing successive pulses at its output ends, 88 a successive pulse generating circuit composed of the above-mentioned flip-flop circuit 86 and the above-mentioned decoder 87, which is also termed a "successive pulse counter", 89 a level function memory adapted to extract or read out a memorized shape therein by applying output pulses produced from the successive pulse generator 88 thereto, 90 an output terminal of the memory 89 at which an extracted waveform signal appears, 91 an inverter, 92 an envelope shape memory, 93 an output terminal of the envelope shape memory 92, 94 an envelope termination detecting terminal at which a signal occurs at the termination of an envelope shape generated from the envelope shape memory 92, 95 a tone keyer circuit, 96 a key-actuated switch for connecting and disconnecting a tone source with the keyer circuit.

Figure 17A:
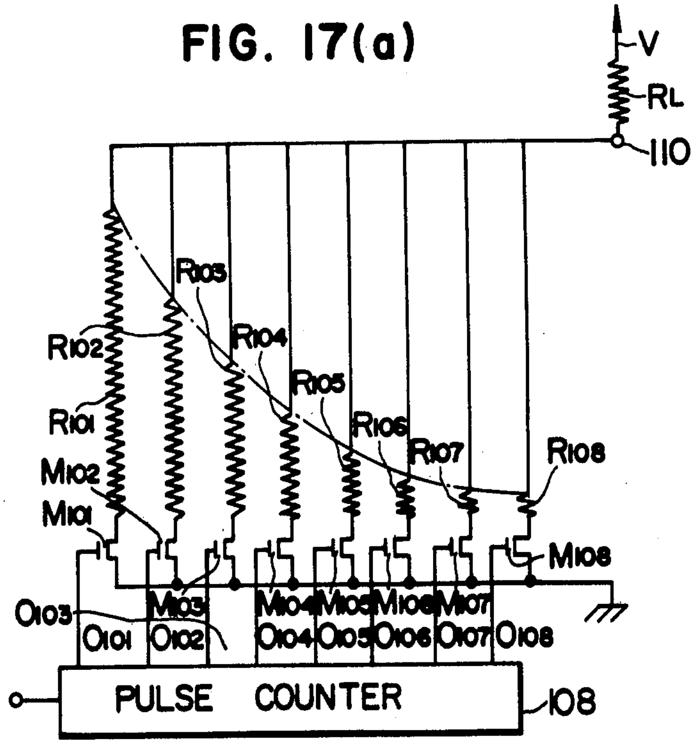
Figure 17B:
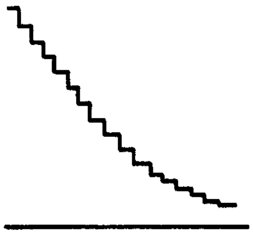
FIG. 17*b* is a waveform obtained from the output of FIG. 17*a*.

Key-actuated switch 81 is provided with a movable contact 81*s* including a movable piece, stationary contacts 81*a* and 81*b*. The movable contact 81*s* having one end grounded is cooperatively connected with a corresponding key and is normally closed to the stationary contact 81*a* which in turn is connected through a load resistor R to a power source. At this state, the contact 81*a* is maintained at zero potential though a power voltage +V is applied thereto. The contact 81*a* is also connected with an input pole of AND gate 81, while the contact 81*b* is normally opened to the movable contact 81*s* and is connected with a setting input terminal of the flip-flop 83 which is adapted to produce an enabling signal in its reset state. The enabling signal producing terminal of the flip-flop 83 is connected with a second input pole of the AND gate 84. To a third input pole of the AND gate 84 is connected the clock pulse generator 82 for permitting a clock pulse to be applied thereto. In the absence of an input from the contact 81*a,* namely, at the ground potential of this contact, the AND gate 84 is not rendered operative. AND gate 85 has, as an input thereof, a signal delivered from the AND gate 84 and has, as the other input, a signal delivered through an inverter 91 from the last-stage output terminal of the decoder 87. The output of the AND gate 85 is connected to be inputted to the first-stage of cascaded flip-flop circuit 86. Upon receipt of a pulse input from the successive pulse generator 88, a memorized level function is read out or extracted, in other words, sampled (scanned) from the level function memory 89. The waveform memory 89 is constructed as shown in FIG. 17(*a*) and also it can be contructed substantially in such a manner as that described in the preceding embodiments, using a row of resistive elements and switching elements which are individually series-connected therewith. The extracted level function appears at the output terminal 90 in the form of a voltage having a varying amplitude. The output terminal 90 is connected to the objects to be controlled such as envelope shape memory 92 with a control input pole, whose output terminal is connected with a control input terminal of the tone keyer circuit 95. The envelope termination detecting terminal 94 provided in the memory 92 which is capable of producing a signal (*h*) at the termination of an envelope shape being delivered to the tone keyer is connected to the reset terminal of the flip-flop 83 and simultaneously to the flip-flop circuit 86 to thereby reset them respectively.

Figures 15A, 15B, 15C, 15D, 15E, 15G, 15H, 15J:
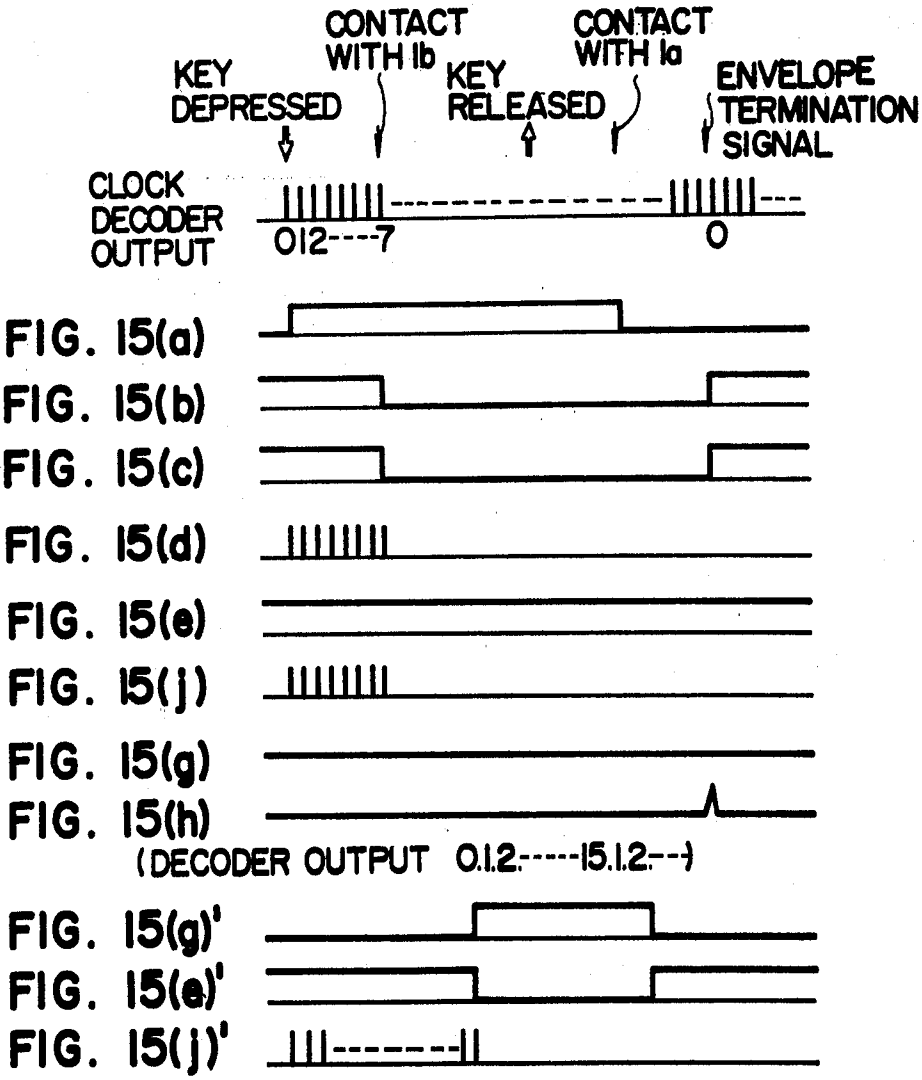
FIG. 15 shows various pulse waveforms developed at each portion of the circuit arrangement shown in FIG. 14.

The tone level control circuit having the aforesaid arrangement will hereunder be described with respect to its operation and functions by referring to the pulse waveforms shown in FIG. 15.

Several pulse waveforms in FIG. 15 correspond to those appearing at several portions of the circuit of FIG. 14 as denoted by alphabets, respectively. The clock pulse generator 82 always generates a series of clock pulses having, for example, a frequency of 800 Hz. When a key is depressed, the movable contact piece of the key-actuated switch 81 departs from the stationary contact 81*a* and makes contact with the other stationary contact 81*b*, and then returns to make contact with the normally circuit-closed contact 81*a*. The change-over time interval of the switch is inversely proportional to the depression speed of the key, which time interval is designed to be in the order of about 1.5 to 20 milliseconds. When the contact 81*a* is opened from ground its potential becomes as shown in FIG. 15(*a*). The AND gate 84 is rendered to its operative state since the third input pole of the gate 84 is supplied with an enabling signal from the flip-flop 83 which is in its reset state, so that clock pulses from the generator 82 are gated to be sent to the subsequent AND gate 85. However, as soon as the movable contact piece 81*a* makes contact with contact 81*b*, the flip-flop 83 is reversed in its state to stop the enabling signal to be sent toward the AND gate 84, whose condition is indicated by the waveforms of FIGS. 15(*b*) and 15(*c*). In other words, when the "set" terminal of the flip-flop 83 is at the ground potential, the enabling signal ceases. Accordingly, for a time interval during which the movable contact piece 81*s* is moving from the contact 81*a* towards the other contact 81*b*, the AND gate 84 generates a series of pulses as shown in FIG. 15(*d*). When the signal of the waveform of FIG. 15(*d*) is entered into the AND gate 85 and is gated therethrough with the other input pole normally having an enabling signal shown in FIG. 15(*e*), those series of clock pulses which are shown in FIG. 15(*f*) are supplied to the first-stage input terminal of the flip-flop circuit 86. Thus, if the decoder 88 is provided with 16 successive output ends, successive pulses will be developed at each terminal from a first output end towards the subsequent output ends of the decoder 88 successively in accordance with the number of the inputted clock pulses. Then, when a pulse appears at the last output end, i.e. at the 16th output end, the produced pulse is inverted by the inverter 91 to thereby render the output (*e*) zero. Thus, successive pulses appearing at the output ends of the decoder 87 function to trigger electronic switching elements—each being connected in series with a dividing resistor forming a memorizing element of the memory 89—successively to turn the switching elements "on, so that parallel-arranged resistors are instantaneously energized through a common load resistor sequentially, of which resistance values are set to correspond to the function to be memorized in the memory 89. These parallel-arranged resistors have a common line leading to the output terminal 90 at which a sampled (scanned) waveform voltage is present for each time interval during which a successive pulse from the decoder is present at the corresponding switching element of the memory. The voltage signal appearing at the terminal 90 is utilized to control the level of the envelope shape memorized in the envelope shape memory 92.

It is now to be noted that, since any voltage occurring at the terminal 90 will not become effective enough to control the level of the envelope shape until the key-actuated on-off switch 96 is turned "on" to lead a tone signal towards the keyer circuit 95, the voltage extracted from the memory 89 functions to effectively conduct the level control of the envelope shape only during the "on" state of the key-actuated switch 96.

The memorized shape of the memory is set to have a decreasing characteristic with respect to time as shown in FIG. 14 or in detail in FIG. 17, by way of illustration. FIGS. 15(*b*)–15(*d*) show that seven pulses are generated from the clock pulse generator until the movable contact piece of the key-actuated switch 81 which starts to be moved at a certain depression speed of the key from the position of contact 81*a* reachs the other stationary contact 81*b*. Then four-stage flip-flops 86 and decoder 87 in combination will produce pulses at the first four output ends of the decoder, and at the time the pulse is developed at the fourth output end, the key-actuated switch 96 is turned "on", and accordingly only a voltage which is extracted from the memory by the pulse derived from the fourth output end of the decoder will become effective to perform the level control of the memorized envelope shape. Thus, when an envelope shape signal which is subjected to level control has been completely fed to the tone keyer circuit 95, a signal having a waveform shown in FIG. 15(*h*) is delivered to both the flip-flop 83 and the flip-flop circuit 86 for resetting, at which the flip-flop 83 again starts to produce an enabling signal to the AND gate 84, as shown by build-up portions of the waveforms in FIGS. 15(*b*) and 15(*c*).

On the other hand, in the event that a key is showly depressed and hence the movable contact piece of the key-actuated switch 81 also slowly makes contact with the opposite contact 81*b*, it will be easily understood that an envelope level control signal becomes small in value due to the decreasing characteristic of the memorized function of the memory 89 provided that the output of the decoder appears at an output end not exceeding the 16th output end upon the switch 96 being closed. The conditions of operation at circuit portions represented by *g*, *e* and *j* are indicated in the form of several waveforms shown in FIG. 15(*g'*), 15(*e'*) and 15(*j'*).

Thus, according to the touch-responsive tone level control circuit of the present invention, an effective voltage signal which permits the control of the levels, frequencies, phases or tone colors of tone signals in accordance with the depression speed of a key can be obtained at an output end of waveform memory without employing the conventional charge-discharge circuit using therein resistor and capacitor. Furthermore, the memorized function can be arbitrarily set to provide a required pattern.

Figure 16:
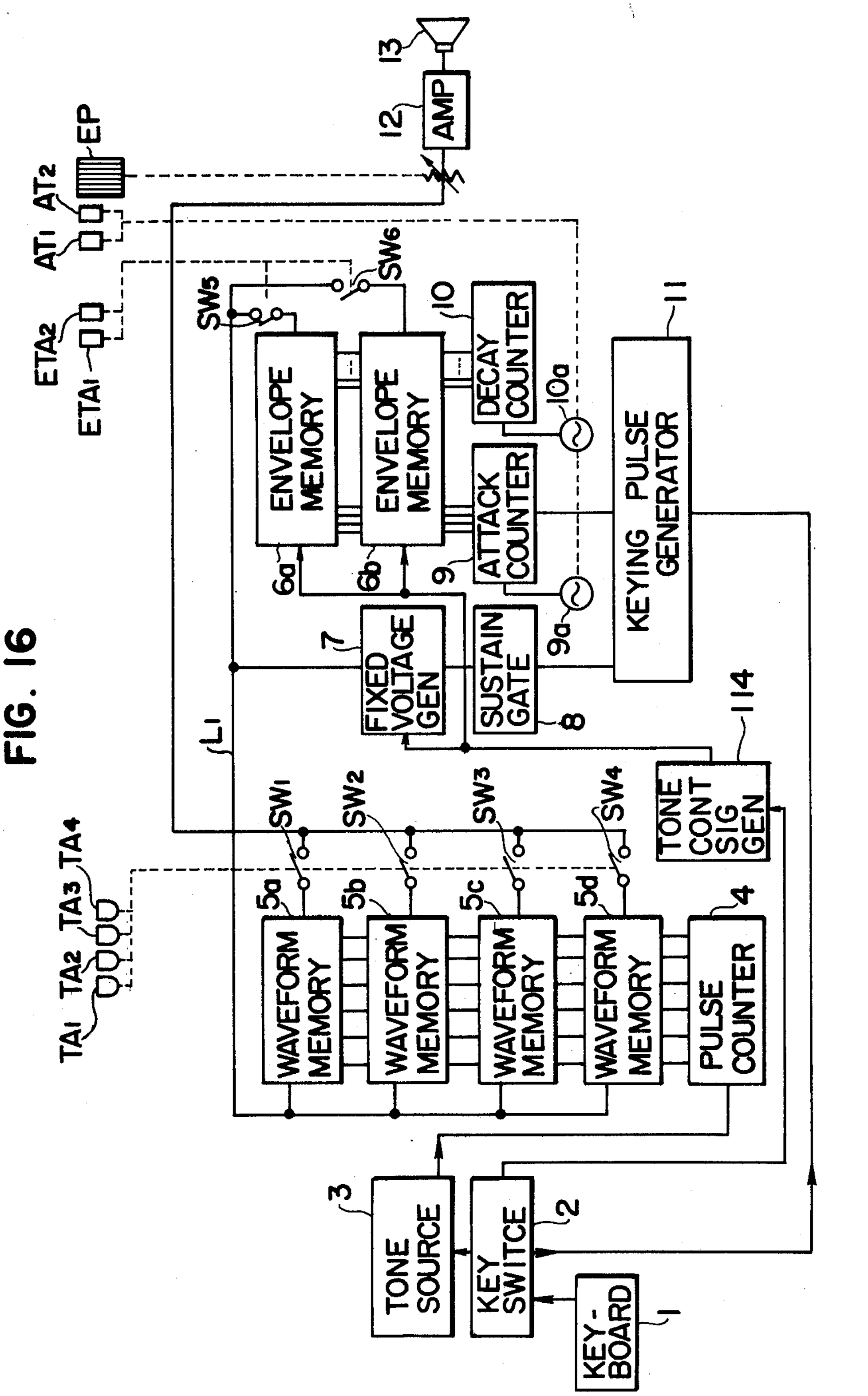
FIG. 16 is a schematic block diagram illustrating a modification of the electronic musical instrument of FIG. 1 to which the circuit arrangement shown in FIG. 14 is applied.

FIG. 16 illustrates a modification of the electronic musical instrument shown in FIG. 1, to which a touch-responsive tone level control circuit according to the above-mentioned embodiment is applied, in which reference numeral 114 denotes a tone control signal generating means which is capable of producing a control voltage whose magnitude depends on the depression speed of a key.

FIGS. 17(*a*) and 17(*b*) illustrate details of the level function memory 89 which are substantially similar to those of FIGS. 4(*a*) and 4(*b*).

What we claim is:

1. A waveform producing system comprising:

a plurality of switches, each of said switches corresponding to a respective basic output frequency, a clock signal generator means having a plurality of outputs connected to said switches for generating a plurality of clock pulse trains, each of said clock pulse trains having a frequency which is a multiple of at least one of said basic output frequencies, means for memorizing the wave shape of a predetermined waveform, said memory means including a plurality of memory elements each of which stores a predetermined value of said waveform corresponding to the amplitude of the predetermined waveform at respective sampling intervals of said waveform, decoder means connected to said memory means for coupling addressing signals thereto, said decoder means including a plurality of outputs, one each connected to a respective memory element, means interconnecting said switches and said decoder means and responsive to said clock pulse trains for energising said decoder means in accordance with the switch closed and the frequency of the clock pulse train coupled thereto, wherein addressing signals are provided at the outputs of said decoder at the frequency of said connected clock pulse train, and wherein the total number of the addressing signals provided at the output terminals of said decoder decreases as the selected basic output frequency selected by the corresponding closed switch increases as different selected switches are closed to thereby maintain the frequency at which said memory elements are addressed within a predetermined small range, and means responsive to said addressed memory elements for reading out the waveform stored in said memory means, said read-out waveform having a basic output frequency corresponding to the closed switch.

2. A waveform producing system comprising:

a plurality of switches, each of said switches corresponding to a respective basic output frequency, a clock signal generator means having a plurality of outputs connected to said switches for generating a plurality of clock pulse trains, each of said clock pulse trains having a frequency which is a multiple of at least one of said basic output frequencies, means for memorizing the wave shape of a predetermined waveform, said memory means including a plurality of memory elements each of which stores a predetermined value of said waveform corresponding to the amplitude of the predetermined waveform at respective sampling intervals of said waveform, decoder means connected to said memory means for coupling addressing signals thereto, said decoder means including a plurality of outputs, one each connected to a respective memory element, means interconnecting said switches and said decoder means and responsive to said clock pulse trains for energizing said decoder means in accordance with the switch closed and the frequency of the clock pulse train coupled thereto, wherein addressing signals are provided at the outputs of said decoder at the frequency of said connected clock pulse train, and wherein the number of output terminals of said decoder providing an address signal decreases by a constant factor as the basic output frequency selected by the corresponding closed switch increases by a constant factor as different selected switches are closed, and means responsive to said addressed memory elements for reading out the waveform stored in said memory means, said read-out waveform having a basic output frequency corresponding to the closed switch.

3. The waveform producing system of claim 2 wherein said memory means include a bank of resistor elements having predetermined resistance values corresponding to the desired waveform amplitude at each of a plurality of sampling intervals of said waveform; said waveform memory means including a common resistor connected in series with said bank of resistors, said common resistor and said bank of resistors jointly comprising a bank of voltage divider circuits, said waveform memory means further including memory switching means responsive to the respective addressing outputs of said decoder means for turning the respective voltage dividers on and off.

4. The waveform producing system of claim 2 wherein said means for energizing said decoder includes a plurality of serially connected frequency dividers, said frequency dividers each having an output connected to said decoder means, and said switches coupling pulse trains of selected frequency to said frequency dividers for energizing successively more dividers as the basic output frequency selected by the closed switch is increased by a constant factor.

5. A waveform producing system comprising:

a clock signal generator means having a plurality of outputs for generating a plurality of clock pulse trains, one of said clock pulse trains being generated at each of said outputs, each of said clock pulse trains having a frequency different from the frequency of the other clock pulse trains, the range of frequencies of said clock pulse trains at the outputs of said generator means defining a discrete frequency interval, a plurality of switches, each switch being connected to one of said outputs of said generator means, the number of switches being a multiple $n$ of the number of outputs of said generator means, each of said switches corresponding to a respective basic output frequency of said system, means for memorizing the wave shape of a predetermined waveform, said memory means including a plurality of memory elements, each of which stores a predetermined value of said waveform corresponding to the amplitude of the predetermined waveform at respective sampling intervals of said waveform, means for interconnecting said switches and said memory means for selectively addressing said memory elements in a predetermined sequence, said interconnecting means comprising means for addressing every $2^i$th memory element as the basic output frequency selected by a closed switch increases by the multiple $i$ as different given switches connected to the same clock signal generator output are closed, and means responsive to said addressing means for reading out the waveform stored in said memory means, said read out waveform having a basic frequency corresponding to the closed switch.

6. The waveform producing system of claim 5 wherein said interconnecting means provides addressing signals at the outputs thereof at the frequency of the pulse train coupled to said interconnecting means and wherein every $2^i$th output terminal of said interconnecting means provides an address signal as the octave corresponding to the closed switch increases by the multiple $i$ from the fundamental frequency octave.

7. The waveform producing system of claim 5 wherein said interconnecting means includes decoder means connected to said memory means for coupling addressing signals thereto, said decoder means including a plurality of outputs, one each connected to a respective memory element, means connected to said switches and responsive to said pulse trains for energizing said decoder means in accordance with the switch and frequency of the pulse train coupled thereto, wherein addressing signals are provided at the outputs of said decoder at the frequency of said coupled pulse train and wherein every $2^i$th output terminal of said decoder provides an address signal at the frequency selected by the closed switch increases past each of $i$ discrete frequency levels.

8. The waveform producing system of claim 7 wherein said means for energizing said decoder includes a plurality of serially connected frequency dividers, said frequency dividers each having an output connected to said decoder means, and said switch coupling pulse trains of selected frequency to said frequency dividers for energizing successively more dividers as the frequency corresponding to the switch increases past each of $i$ discrete frequency levels.

9. A waveform producing system comprising:

a clock signal generator means having a plurality of outputs for generating a plurality of clock pulse trains, one of said clock pulse trains being generated at each of said outputs, each of said clock pulse trains having a frequency different from the frequency of the other clock pulse trains, the range of frequencies of said clock pulse trains at the outputs of said generator means defining a fundamental frequency octave, a plurality of switches, each switch being connected to one of said outputs of said generator means, the number of switches being a multiple $n$ of the number of outputs of said generator, each of said switches corresponding to a respective fundamental output frequency of said system, means for memorizing the wave shape of a predetermined waveform, said memory means including a plurality of memory elements each of which stores a predetermined value of said waveform corresponding to the amplitude of the predetermined waveform at respective sampling intervals of said waveform, and means interconnecting said switches and said memory means for selectively addressing said memory elements in a predetermined sequence, said interconnecting means comprising means for addressing every $2^i$th memory element as the octave of the basic output frequency selected by a closed switch increases by the multiple $i$ as different given switches connected to the same clock signal generator output are closed.

* * * * *